United States Patent
Lee et al.

(10) Patent No.: US 8,617,944 B2
(45) Date of Patent: Dec. 31, 2013

(54) METHOD OF ETCHING A PIXEL ELECTRODE

(71) Applicant: Samsung Display Co., Ltd., Yongin (KR)

(72) Inventors: Byeong-Jin Lee, Yongin-si (KR); Hong-Sik Park, Suwon-si (KR); Sang-Tae Kim, Iksan-si (KR); Joon-Woo Lee, Jeonju-si (KR); Young-Chul Park, Iksan-si (KR); Young-Jun Jin, Iksan-si (KR); Suck-Jun Lee, Jeonju-si (KR); Seung-Jae Yang, Jeonju-si (KR); O-Byoung Kwon, Jeollabuk-do (KR); In-Ho Yu, Iksan-si (KR); Sang-Hoon Jang, Jeonju-si (KR); Min-Ki Lim, Iksan-si (KR); Hye-Ra Shin, Guir-si (KR); Yu-Jin Lee, Iksan-si (KR)

(73) Assignees: Dongwood Fine-Chem Co., Ltd. (KR); Samsung Display Co., Ltd. (KR)

( * ) Notice: Subject to any disclaimer, the term of this patent is extended or adjusted under 35 U.S.C. 154(b) by 0 days.

(21) Appl. No.: 13/783,083

(22) Filed: Mar. 1, 2013

(65) Prior Publication Data

US 2013/0178023 A1  Jul. 11, 2013

Related U.S. Application Data

(62) Division of application No. 12/947,296, filed on Nov. 16, 2010, now Pat. No. 8,409,999.

(30) Foreign Application Priority Data

Jan. 26, 2010  (KR) .......................... 10-2010-0007068

(51) Int. Cl.
*H01L 21/00* (2006.01)
*H01L 21/302* (2006.01)

(52) U.S. Cl.
USPC .......................................... 438/158; 438/754

(58) Field of Classification Search
USPC .................... 438/754; 257/E33.064, E31.176
See application file for complete search history.

(56) References Cited

U.S. PATENT DOCUMENTS

| | | | |
|---|---|---|---|
| 5,340,491 A | 8/1994 | Enomoto et al. | |
| 5,456,795 A | 10/1995 | Danjo et al. | |
| 5,700,389 A | 12/1997 | Nakagawa | |
| 5,780,500 A | 7/1998 | Betschart et al. | |
| 5,780,501 A | 7/1998 | Betschart et al. | |
| 6,376,353 B1 | 4/2002 | Zhou et al. | |
| 2006/0043332 A1 | 3/2006 | Cho et al. | |
| 2006/0094241 A1 | 5/2006 | Park et al. | |
| 2009/0174835 A1 | 7/2009 | Lee et al. | |
| 2010/0291722 A1 | 11/2010 | Kim et al. | |

FOREIGN PATENT DOCUMENTS

| | | |
|---|---|---|
| KR | 1019960031452 | 9/1996 |
| KR | 1019970065685 A | 10/1997 |
| KR | 1020000017470 A | 3/2000 |
| KR | 20080107502 A | 11/2008 |

*Primary Examiner* — Kevin Parendo
(74) *Attorney, Agent, or Firm* — Innovation Counsel LLP (57) ABSTRACT

An etchant composition for etching a transparent electrode is provided, the etchant composition includes an inorganic acid, an ammonium ($NH_4^+$)-containing compound, a cyclic amine compound, and the remaining amount of water.

8 Claims, 12 Drawing Sheets

METHOD OF ETCHING A PIXEL ELECTRODE

CROSS-REFERENCE TO RELATED APPLICATION

This application is a Divisional application of U.S. patent application Ser. No. 12/947,296 filed on Nov. 16, 2010, which claims priority to and the benefit of Korean Patent Application No. 10-2010-0007068 filed in the Korean Intellectual Property Office on Jan. 26, 2010 in the Korean Intellectual Property Office (KIPO), and all the benefits accruing therefrom under 35 U.S.C. §119, the contents of the prior applications being herein incorporated by reference

BACKGROUND OF THE INVENTION (a) Field of the Invention

The present invention relates a transparent electrode etchant composition and an etching method using the same.

(b) Description of the Related Art

Indium oxide layers, particularly indium zinc oxide (hereafter referred to as "IZO") layers and indium tin oxide (hereafter, referred to as "ITO") layers, are used as a transparent electrodes for various electronic products.

To form an IZO or ITO transparent electrode, and IZO or ITO layer is generally deposited on an insulation substrate by sputtering, a photoresist is then coated thereon and is exposed and developed to form a photoresist pattern. The indium oxide layer is then etched by using the photoresist pattern.

The indium oxide layer typically has excellent chemical resistance, and therefore is a material that is hard to etch. Examples of etchants used to etch indium oxide layers include a nitro-hydrochloric acid (HCl+HNO3) etchant disclosed Korea Patent Laid-Open Publication No. 1996-0031452, an etchant made of one material selected from hydrochloric acid, a weak acid, and an alcohol disclosed in Korea Patent Laid-Open Publication No. 1997-0065685, a FeCl3+HCl etchant disclosed in U.S. Pat. No. 5,456,795, and an etchant including oxalic acid and a salt thereof or aluminum chloride as a main component disclosed in Korea Patent Laid-Open Publication No. 2000-0017470.

Also, an etchant including HI and FeCl3 is disclosed in U.S. Pat. No. 5,340,491.

However, in the case of the nitro-hydrochloric acid etchant, although the cost of the etchant is low, in practice the etching is too fast at the side surface of the photoresist pattern, and as a result the profile of the side surface pattern is poor. In addition, the main component of the etchant, the hydrochloric acid and the nitric acid is easily volatilized, and thus the composition of the etchant can vary significantly over the course of time.

In the case of the FeCl3+HCl etchant, the main component is also hydrochloric acid, and the composition of the etchant can also vary significantly over the course of time.

With respect to etchants that include oxalic acid, although etching with such an etchant is easily executed, the solubility of oxalic acid is low at a low temperature such that precipitate may be generated.

In the case of the etchant that includes HI, the etching speed is fast and the side etching is relatively small, however the cost is high and toxicity and corrosion levels are high, such that the ability to use such etchants in actual processes is limited.

In addition, the above-described conventional etchants all have almost the same strong chemical activity, and as a result erosion of an adjacent metal having poor chemical resistance, such as copper (Cu), aluminum (Al), molybdenum (Mo), and chromium (Cr), may occur when the etchant is used.

These etchant are typically applied to multilayered structures that include at least one of the above-described metals.

The above information disclosed in this Background section is only for enhancement of understanding of the background of the disclosure and therefore it may contain information that does not form the prior art that is already known to a person of ordinary skill in the art.

SUMMARY OF THE INVENTION

According to one aspect, an etchant composition is provided. By using the etchant composition, etch selectivity is increased between an indium oxide layer deposited on an electronic product substrate and an adjacent layer made of copper or aluminum during etching to eliminate damage to the lower layer, reproducibility of the etching process is improved, and stability of the etchant with to temperature is increased.

An etchant composition for a transparent electrode layer includes an inorganic acid, an ammonium ($NH_4^+$)-containing compound, a cyclic amine compound, and the remaining amount of water.

The concentration of the inorganic acid may be from 1 to 20 wt % of the entire etchant composition, the concentration of the ammonium containing compound may be from 0.1 to 5.0 wt % of the entire etchant composition, and the concentration of the cyclic amine compound may be from 0.1 to 5.0 wt % of the entire etchant composition.

The cyclic amine compound may include at least one of aminotetrazole, benzotriazole ($C_6H_5N_3$), imidazole, indol, phulin, pyrazolel, pyridine, pyrimidine, pyrrol, pyrrolidine, and pyrroline.

The inorganic acid may include at least one of $H_2SO_4$, $H_3PO_4$, $HNO_3$, HCl, and $HClO_4$.

The ammonium (NH4+)-containing compound may include at least one of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

The transparent electrode layer may include indium zinc oxide (IZO) or indium tin oxide (ITO).

The etchant composition may further include at least one of a surfactant, a metal ion sequestering agent, and a corrosion inhibitor.

In another aspect, an etch method of a transparent electrode layer includes: forming a transparent electrode layer on a substrate; forming a photo-register pattern on the transparent electrode layer; and etching a transparent electrode layer by using an etchant, wherein the etchant includes an inorganic acid, an ammonium ($NH_4^+$)-containing compound, a cyclic amine compound, and the remaining amount of water.

The concentration of the inorganic acid may be from 1 to 20 wt % of the entire etchant composition, the concentration of the ammonium containing compound may be from 0.1 to 5.0 wt % of the entire etchant composition, and the concentration of the cyclic amine compound may be from 0.1 to 5.0 wt % of the entire etchant composition.

The cyclic amine compound may include at least one of aminotetrazole, benzotriazole, imidazole, indol, phulin, pyrazolel, pyridine, pyrimidine, pyrrol, pyrrolidine, and pyrroline.

The inorganic acid may include at least one of $H_2SO_4$, $H_3PO_4$, $HNO_3$, HCl, and $HClO_4$.

The ammonium ($NH_4^+$) containing compound may include at least one of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

The transparent electrode layer may include indium zinc oxide (IZO) or indium tin oxide (ITO).

The etchant composition may further include at least one of a surfactant, a metal ion sequestering agent, and a corrosion inhibitor.

The method may further include forming an element for a liquid crystal display on the substrate.

In yet another aspect, a manufacturing method of a thin film transistor array panel includes: forming a gate line on a substrate; forming a gate insulating layer covering the gate line; forming a semiconductor layer on the gate insulating layer; forming a data line and a drain electrode on the semiconductor layer; forming a passivation layer having a contact hole on the data line; forming a first pixel electrode connected to the drain electrode through the contact hole on the passivation layer; removing the first pixel electrode by using an etchant; and forming a second pixel electrode connected to the drain electrode through the contact hole on the passivation layer, wherein the etchant includes an inorganic acid, an ammonium ($NH_4^+$)-containing compound, a cyclic amine compound, and the remaining amount of water.

The data line and the drain electrode may have a double-layered structure including a lower layer and an upper layer, the lower layer may be formed of titanium (Ti), and the upper layer may be formed of copper (Cu).

The concentration of the inorganic acid may be from 1 to 20 wt % of the entire etchant composition, the concentration of the ammonium containing compound may be from 0.1 to 5.0 wt % of the entire etchant composition, and the concentration of the cyclic amine compound may be from 0.1 to 5.0 wt % of the entire etchant composition.

The cyclic amine compound may include at least one of aminotetrazole, benzotriazole, Imidazole, indol, phulin, pyrazolel, pyridine, pyrimidine, pyrrol, pyrrolidine, and pyrroline.

The inorganic acid may include at least one of $H_2SO_4$, $H_3PO_4$, $HNO_3$, HCl, and $HClO_4$.

The first pixel electrode and the second pixel electrode may include indium zinc oxide (IZO) or indium tin oxide (ITO).

Accordingly, at least one inorganic acid as the main oxidizing agent, the ammonium ($NH_4^+$)-containing compound, the cyclic amine compound, and the remaining amount of water are included in the etchant composition such that damage to the photoresist is not generated during the etch process, remnants do not remain after the etch process, and undesirable etching and degradation of aluminum and copper used in the lower layer is not generated, and thereby productivity may be improved when manufacturing a substrate for electronic parts such as a flat panel display.

DETAILED DESCRIPTION OF THE EMBODIMENTS

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope of the present invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

An etchant composition of a transparent electrode layer according to an exemplary embodiment includes a main oxidizing agent, an additive, and water.

In detail, the etchant composition includes an inorganic acid including at least one of $H_2SO_4$, $HNO_3$, $H_3PO_4$, HCl, and $HClO_4$ as the main oxidizing agent, an ammonium ($NH_4$)-containing compound, a cyclic amine compound, and water.

The transparent electrode layer may be made of indium zinc oxide (IZO) or indium tin oxide (ITO). IZO means an oxide in which $In_2O_3$ and ZnO are mixed in an appropriate ratio, and ITO means an oxide in which $In_2O_3$ and $SnO_2$ are mixed in an appropriate ratio.

In the etchant composition according to an exemplary embodiment, the $NH_4^+$ containing compound may include at least one of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

In the etchant composition according to an exemplary embodiment, the cyclic amine compound may include at least one of aminotetrazole, benzotriazole, imidazole, indol, phulin, pyrazolel, pyridine, pyrimidine, pyrrol, pyrrolidine, and pyrroline.

The cyclic amine compound included at least one of aminotetrazole, benzotriazole, imidazole, indol, phulin, pyrazolel, pyridine, pyrimidine, pyrrol, pyrrolidine, and pyrroline are included in a water-soluble heterocyclic amine compound.

Although it is not described above, the water-soluble heterocyclic amine compound as the cyclic amine compound may be included in the etchant composition according to an exemplary embodiment. The water-soluble heterocyclic amine compound as the cyclic amine compound may be used alone or together as two or more.

When using the etchant composition that includes the main oxidizing agent, the ammonium containing compound, and the cyclic amine compound to etch a transparent electrode layer deposited on the substrate for, for example, electronic parts, etch selectivity for the indium oxide layer is high compared with non-indium oxide layers, such as, for example, aluminum or copper layers. As used herein, "etch selectivity" means a ratio between the amount of the indium oxide layer etched and the amount of the non-indium oxide layer etched for the same etchant composition. In addition, the etchant composition improves reproducibility of the etching process, and increases the stability of the etchant over a range of temperatures.

In the etchant composition, the main oxidizing agent may have a concentration between 1 to 20 wt % (wt % is defined herein as weight of composition/total weight of composition), the ammonium containing compound between 0.1 to 5.0 wt %, the cyclic amine compound between 0.1 to 5.0 wt %, and the remaining amount water. In detail, for the total weight of the composition, the main oxidizing agent typically has a concentration of between 7 to 20 wt %, the ammonium containing compound typically has a concentration of between 0.2 to 3.0 wt %, the cyclic amine compound typically has a concentration of between 0.2 to 3.0 wt %, and the remaining amount of water.

For the main oxidizing agent, which is included in the composition to etch transparent electrode layers, such as indium oxide layer, when the concentration is less than about 1 wt %, the etch speed is too slow, and when the concentration is more than about 20 wt %, the photoresist and/or the neighboring metal may be attacked by the etchant.

With the ammonium ($NH_4^+$)-containing compound, which is included in the etchant to reduce the attack on aluminum that may be used as the neighboring metal to the transparent electrode, when the concentration is less than 0.1 wt %, the effect of reducing chemical attack on aluminum may not be generated, and when at the concentration is more than 5.0 wt %, the etch speed of the transparent conductive layer such as indium oxide layer may be influenced.

With the cyclic amine compound, which is included in the etchant to reduce the attack on copper used as the metal neighboring the transparent electrode layer, when at the concentration is less than 0.1 wt %, the desired effect of reducing the attack on neighboring copper may not be generated, and when at the concentration is more than 5.0 wt %, the etch speed of the transparent conductive layer, such as an indium oxide layer, may be influenced.

The water used in the etchant composition for the transparent electrode layer according to an exemplary embodiment is not limited, however deionized water, particularly deionized water having a resistivity value (as a measure of the degree that ions are removed in water) of more than 18 MΩ/cm may be used.

The etchant composition according to an exemplary embodiment may also include various additives to improve the etch performance of the transparent electrode layer. Such additives may include, but are not limited to, for example, a surfactant, a metal ion sequestering agent, or a corrosion inhibitor. The surfactant is added to decrease the surface tension, which may increase the etching uniformity, and anionic surfactants, cationic surfactants, amphoteric surfactants, and nonionic surfactants may be used as the surfactant which is stable against the etchant. Typically, a fluorine surfactant may be added to the etchant composition according to an exemplary embodiment. The additives may be added in the range of 0.0001 wt % to 0.01 wt % for the composition total weight.

In a method of etching a transparent electrode layer according to another exemplary embodiment, the transparent electrode layer may be etched by using the above-described etchant composition.

The method of etching the transparent electrode layer may include the following steps. A transparent electrode layer is formed on the substrate for the electronic parts, a photo-resist pattern is typically formed on the transparent electrode layer, and the transparent electrode layer is etched by using the above-described etchant.

The transparent electrode layer typically includes the indium oxide layer. The substrate may be a glass substrate or a quartz substrate as are generally used for display devices. The indium oxide layer is formed on the substrate through sputtering, and the thickness thereof may be in the range of about 200 to 2000 Å.

A structure for the display device may be formed between the substrate and the indium oxide layer. The structure for the display device is a structure in which a conductive material, an organic or inorganic insulating material, or an amorphous or crystallized silicon semiconductor layer is deposited through sputtering or chemical vapor deposition, and is patterned by a photolithography process.

Also, a cleaning process may be generally applied to the substrate.

The process of etching the transparent electrode layer by using the etchant may be performed through dipping or spraying.

The temperature of the etchant during the etch process may be in the range of 20° C. to 50° C., and the appropriate temperature may be changed according to other processes and other factors.

EXAMPLES

Examples of the etchant composition according to the embodiments along with comparative examples, and the results of etching a transparent electrode substrate with such etchant compositions are described below. Table 1 lists the compositions of Examples 1 to 5 and Comparative Examples 1 and 2. Table 2 lists the results of etching various test substrates with the example etchant compositions. FIGS. 1 to 6 are photographs of profiles through an electron microscope showing different layers after etching with certain of the example etchant compositions.

Examples 1 to 5

Table 1, below, lists the compositions of five examples, labeled Example 1 to 5. The main oxidizing agent in Examples 1 to 5 is a combination of nitric acid, sulfuric acid, and hydrochloric acid. Sulfuric acid ammonium $(NH_4)_2SO_4$ is the ammonium ($NH_4^+$)-containing compound and benzotriazole ($C_6H_5N_3$) is the cyclic amine compound in the Examples 1 to 5. To make the etchants, the main oxidizing agent, ammonium ($NH_4^+$)-containing compound and cyclic amine compound are mixed in the concentrations (wt %) listed in Table 1, and then the deionized water is added to be a total of 100 wt %.

The effect of the various etchant compositions was tested on various test substrates. The test substrates include an amorphous ITO substrate having a thickness of about 550 Å and patterned, which is used to estimate the etch speed of the etchant compositions; a triple-layered substrate of Mo/Al/Mo, which is used to estimate the degree of attack on the aluminum in a substrate by the etchant composition; and, a double-layered substrate of Cu/Ti, which is used to estimate the degree of attack on the copper in a substrate by the etchant compositions. The substrates were etched using the spray method at an etch temperature of 43° C. For the etching of the a triple-layered substrate of Mo/Al/Mo, which is used to estimate the degree of attack, and the double-layered substrate of Cu/Ti, which is used to estimate the degree of attack on the copper in a substrate by the etchant compositions, an etching period of 10 minutes was used.

The results are shown in Table 2. The etching point detector time (hereinafter, EPD Time) of the amorphous ITO in Examples 1 to 5 was in the range of 40 to 50 seconds, and the degree of attack on neighboring aluminum and copper was minimal.

Figure 1:
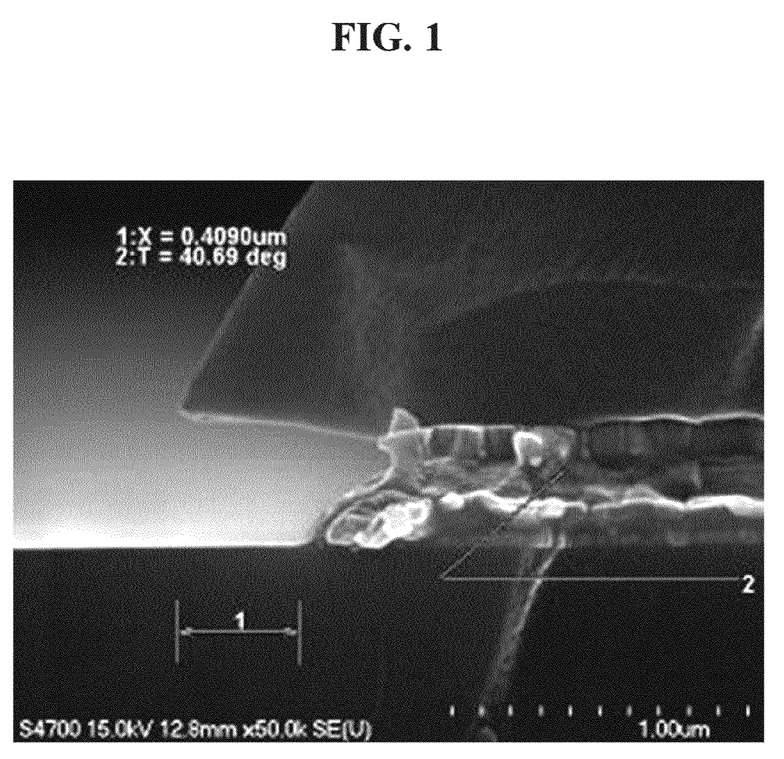
FIG. 1 is a photograph of a profile observed through an electron microscope after etching an aluminum layer by using an etchant for a transparent electrode according to Example 2.
Figure 2:
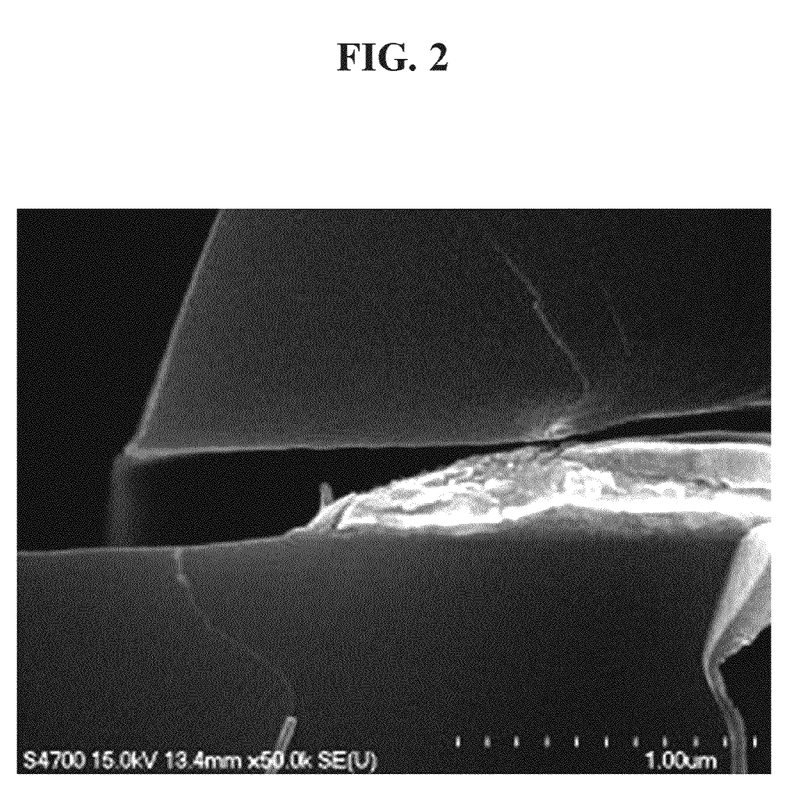
FIG. 2 is a photograph of a profile observed through an electron microscope after etching a copper layer by using an etchant for a transparent electrode according to Example 2.

Among the Examples 1 to 5, the fastest etch speed, which was 40 seconds, occurred with the etchant composition of Example 2. An assessment of the degree of attack on aluminum and copper from the etchant composition of Example 2 are shown in FIG. 1 and FIG. 2. FIG. 1 is a photograph of a profile observed through an electron microscope after etching an aluminum layer by using an etchant for a transparent electrode according to Example 2 and using the conditions described above for Examples 1 to 5. FIG. 2 is a photograph of a profile observed through an electron microscope after etching a copper layer by using an etchant for a transparent electrode according to Example 2 and using the conditions described above for Examples 1 to 5.

Comparative Example 1 to 2

Table 1 also lists the compositions of two comparative example etchant compositions, labeled Comparative Example 1 and 2. The etchant compositions of Comparative Examples 1 and 2 were manufactured using the same method as described above for Examples 1 to 5, and the same method of etching of the test substrates was used.

Figure 3:
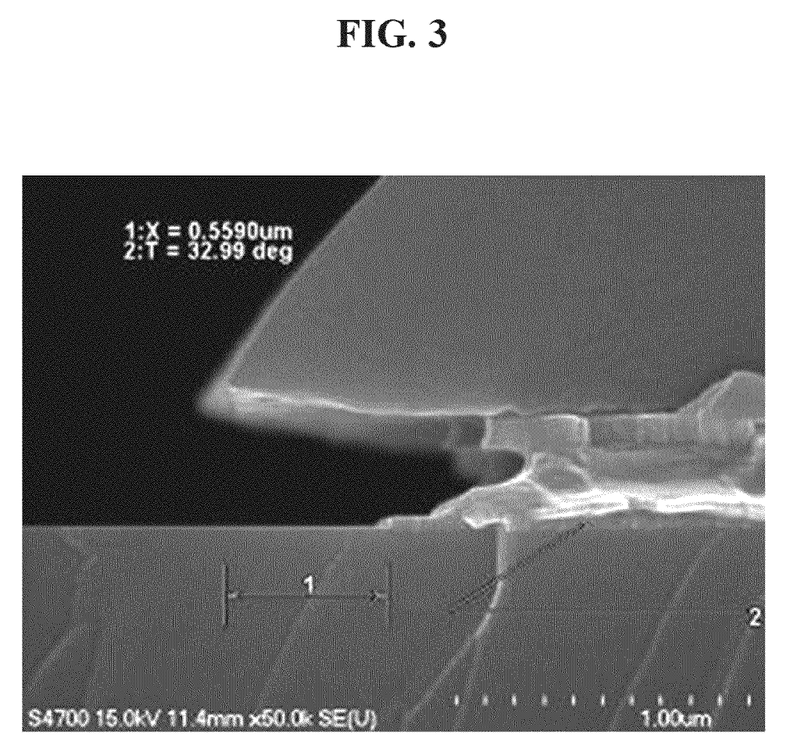
FIG. 3 is a photograph of a profile observed through an electron microscope after etching an aluminum layer by using an etchant for a transparent electrode according to Comparative Example 1.
Figure 4:
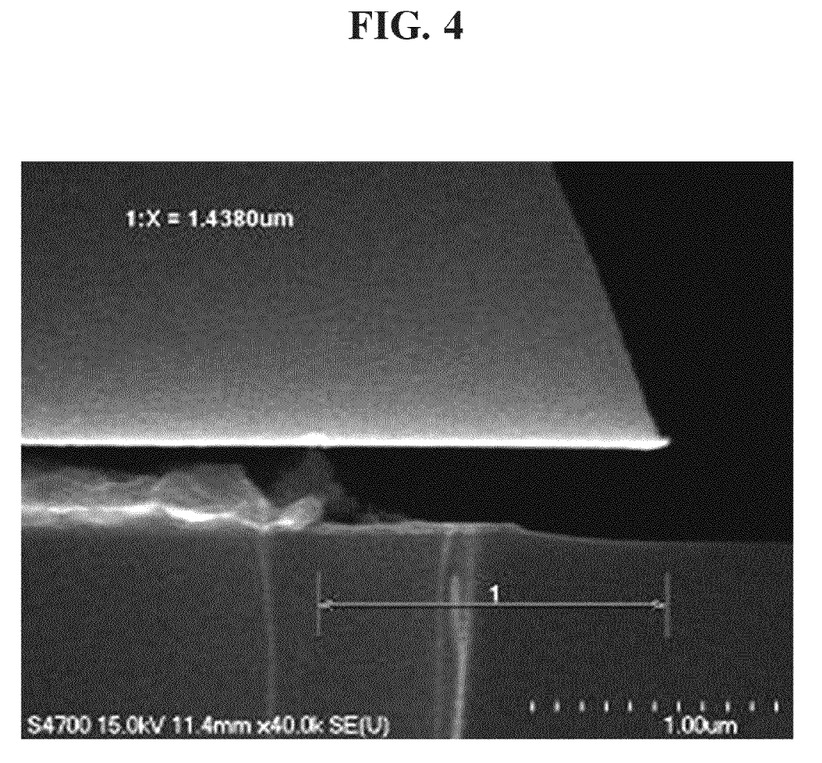
FIG. 4 is a photograph of a profile observed through an electron microscope after etching a copper by using an etchant for a transparent electrode according to Comparative Example 1.

The results thereof are shown in Table 2. Comparative Example 1 is the etchant composition without the cyclic amine compound. For Comparative Example 1, the EPD time of the amorphous ITO is 40 seconds. The degree of attack on aluminum was slight, however, the degree of attack on the copper was significant. The degree of attack on aluminum and copper from the etchant composition of Comparative Example 1 is shown in FIG. 3 and FIG. 4. FIG. 3 is a photograph of a profile observed through an electron microscope after etching an aluminum layer by using an etchant for a transparent electrode according to Comparative Example 1. FIG. 4 is a photograph of a profile observed through an electron microscope after etching a copper by using an etchant for a transparent electrode according to Comparative Example 1. The aluminum was attacked as shown in FIG. 3, and the copper was attacked in shown in FIG. 4.

Comparative Example 2 is the etchant composition in which HCl of the main oxidizing agent and benzotriazole ($C_6H_5N_3$) of the cyclic amine compound are not used. For Comparative Example 2, the EPD time of the amorphous ITO is 50 seconds such that the etch speed is slightly slower than Example 2. The degree of attack on the aluminum attack was minimal, however the degree of attack on copper was significant.

Figure 5:
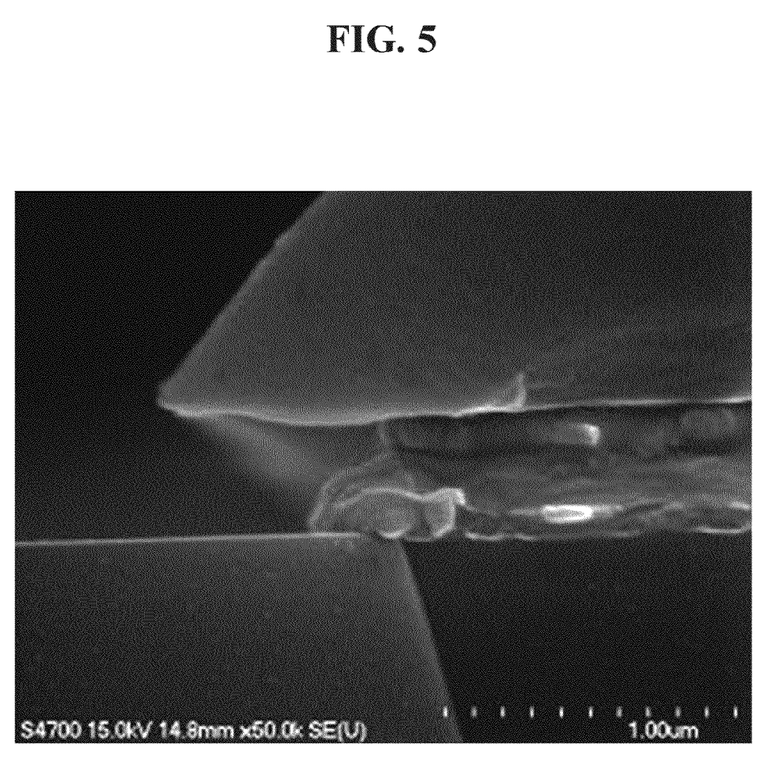
FIG. 5 is a photograph of a profile observed through an electron microscope after etching an aluminum layer by using an etchant for a transparent electrode according to Comparative Example 2.
Figure 6:
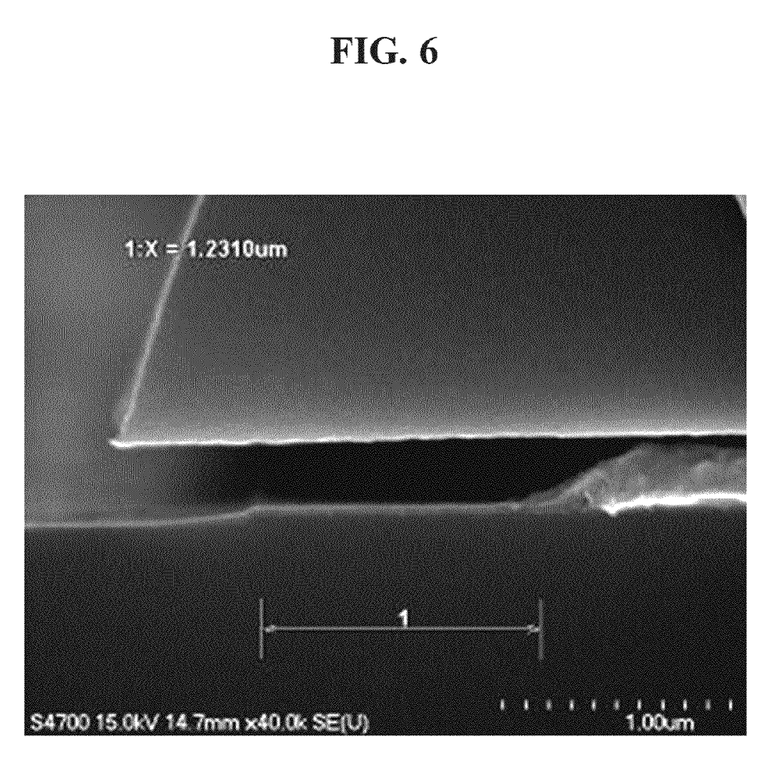
FIG. 6 is a photograph of a profile observed through an electron microscope after etching a copper layer by using an etchant for a transparent electrode according to Comparative Example 2.

The degree of attack on aluminum and copper from the etchant composition of Comparative Example 2 is shown in FIG. 5 and FIG. 6. FIG. 5 is a photograph of a profile observed through an electron microscope after etching an aluminum layer by using an etchant for a transparent electrode according to Comparative Example 2. FIG. 6 is a photograph of a profile observed through an electron microscope after etching a copper layer by using an etchant for a transparent electrode according to Comparative Example 2. The aluminum was not attacked as shown in FIG. 5, and the copper was attacked in shown in FIG. 6.

TABLE 1

| Division | $HNO_3$ (wt %) | $H_2SO_4$ (wt %) | HCl (wt %) | $(NH_4)_2SO_4$ (wt %) | $C_6H_5N_3$ (wt %) | Water |
|---|---|---|---|---|---|---|
| Example 1 | 10 | 5 | 1 | 1 | 0.5 | Remaining amount |
| Example 2 | 10 | 5 | 2 | 1 | 0.5 | Remaining amount |
| Example 3 | 10 | 3 | 2 | 1 | 0.5 | Remaining amount |
| Example 4 | 10 | 5 | 2 | 2 | 0.5 | Remaining amount |
| Example 5 | 10 | 5 | 2 | 1 | 2 | Remaining amount |
| Comparative Example 1 | 10 | 5 | 2 | 1 | 0 | Remaining amount |
| Comparative Example 2 | 7 | 5 | 0 | 1 | 0 | Remaining amount |

※ $C_6H_5N_3$: Benzotriazole (BTA)

TABLE 2

| Division | a-ITO EPD(sec) | Al attack | Cu attack |
|---|---|---|---|
| Example 1 | 50 | NO | NO |
| Example 2 | 40 | NO | NO |
| Example 3 | 45 | NO | NO |

TABLE 2-continued

| Division | a-ITO EPD(sec) | Al attack | Cu attack |
|---|---|---|---|
| Example 4 | 50 | NO | NO |
| Example 5 | 50 | NO | NO |
| Comparative Example 1 | 40 | YES | YES |
| Comparative Example 2 | 50 | NO | YES |

Comparing Comparative Example 2 and Example 2

Table 3 shows in detail the degree of attack on aluminum and copper in the cases of Comparative Example 2 and Example 2.

To evaluate the degree of attack on aluminum and copper, in one test an aluminum layer or a copper layer was etched after forming a photo-resist pattern on the aluminum layer or the copper layer, and in another test the aluminum layer or the copper layer is etched without the photo-resist pattern.

In the test case in which the photo-resist pattern was formed, the distance that the aluminum layer or the copper layer is etched in the width direction under the photo-resist pattern is measured. In the test case in which the photo-resist pattern is not formed, the change in the height of the aluminum layer or the copper layer is measured.

As shown in the result of Table 3, in when the etchant composition of Comparative Example 2 was used, the aluminum layer is not measurably etched during the etch time of 10 min, such that the degree of attack on the aluminum is minimal. The copper layer, however, is directly etched, and the degree of the attack on the copper is significant.

In comparison, when the etchant composition of Example 2 is used, the aluminum and the copper are not measurably etched during the etch time of 7 min, and the etching of the aluminum and copper has progressed only a small amount after the passage of the etch time of 10 min. Accordingly it may be interpreted that the degree of attack on the aluminum and the copper is minimal.

Although there are differences in the amounts of etching that are generated between the test case in which the photo-resist pattern exists and the case in which it does not exist, the trends for the degree of attack on the aluminum and copper are, however, the same.

TABLE 3

| Division | | | Time (min) 1 | 3 | 5 | 7 | 10 | 15 | 20 |
|---|---|---|---|---|---|---|---|---|---|
| Comparative Example 2 | Al Damage | PR Yes (um) | 0 | 0 | 0 | 0 | 0 | 0.04 | 0.10 |
| | | PR No (um) | 0 | 0 | 0 | 0 | 0 | 0.04 | 0.11 |
| | Cu Damage | PR Yes (um) | 0.11 | 0.57 | 0.86 | 0.01 | 1.23 | 1.81 | 1.98 |
| | | PR No (um) | 0.10 | 0.24 | 0.34 | 0.39 | 0.62 | 0.79 | 1.00 |
| Example 2 | Al Damage | PR Yes (um) | 0 | 0 | 0 | 0 | 0.03 | 0.11 | 0.16 |
| | | PR No (um) | 0 | 0 | 0 | 0 | 0.05 | 0.12 | 0.21 |
| | Cu Damage | PR Yes (um) | 0 | 0 | 0 | 0 | 0 | 0.02 | 0.04 |
| | | PR No (um) | 0 | 0 | 0 | 0 | 0.02 | 0.03 | 0.05 |

Figure 7:
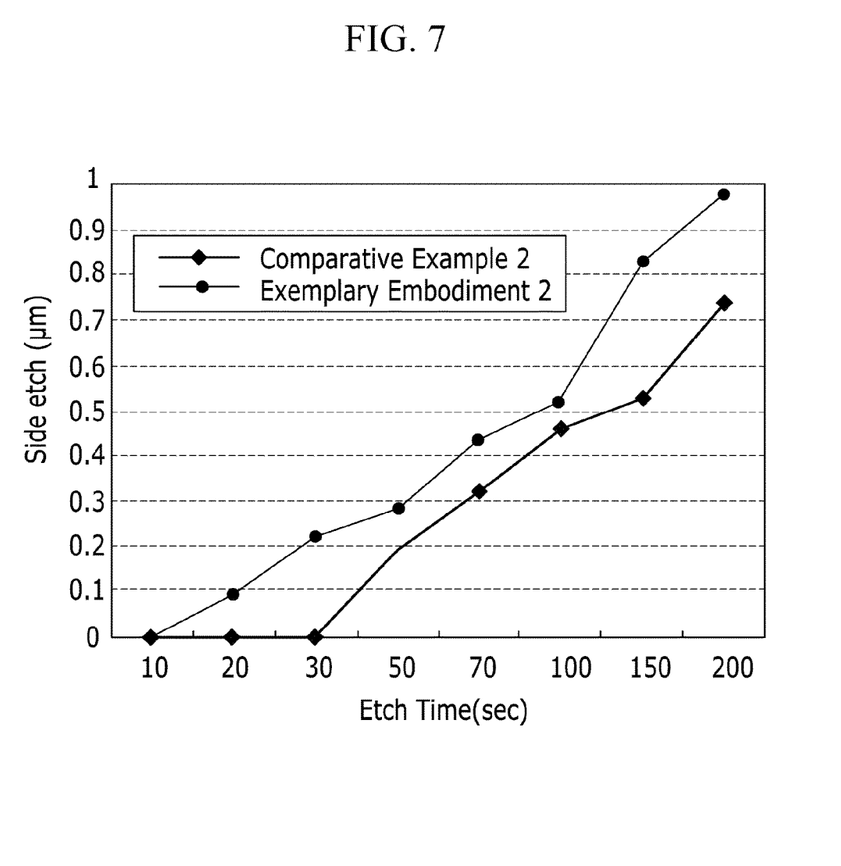
FIG. 7 and FIG. 8 are graphs showing an etching degree of a transparent electrode according to etching time for an exemplary embodiment and Comparative Example 2.
Figure 8:
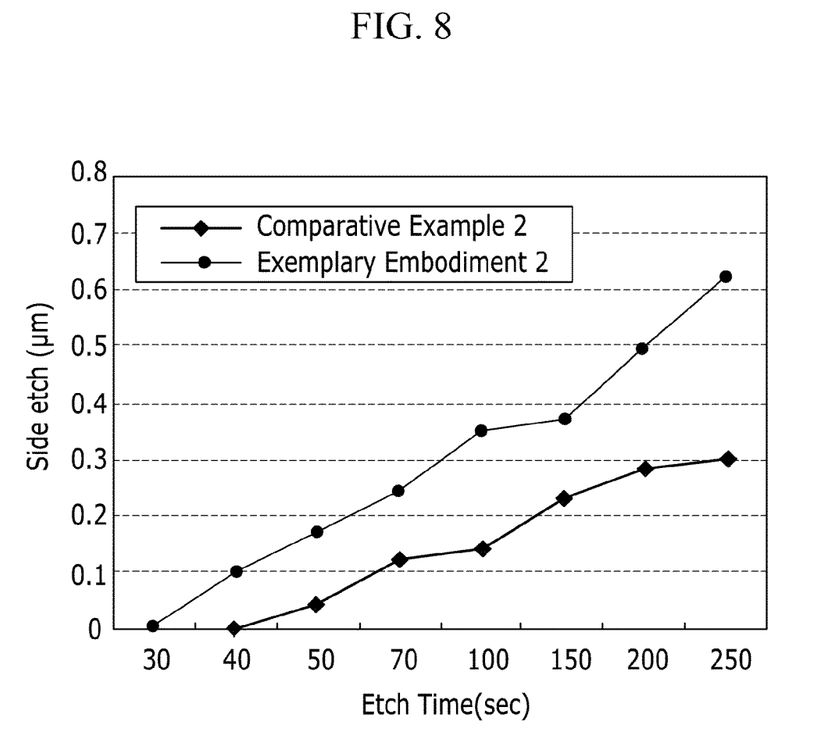

FIG. 7 and FIG. 8 are graphs showing the degree of etching of a transparent electrode as a function of etching time for the etchant composition of Example 2 and Comparative Example 2. In FIG. 7 is the transparent electrode layer of IZO, and in FIG. 8 is the transparent electrode layer of the amorphous ITO.

Table 4 lists the degree of etching the transparent electrode layer for the etch time for the etchant compositions of Example 2 and Comparative Example 2.

TABLE 4

| Division | | EPD (sec) | Side etch per Etch Time (um) 10 | 20 | 30 | 50 | 70 | 100 | 150 | 200 |
|---|---|---|---|---|---|---|---|---|---|---|
| IZO | Comparative Example 2 | 30 | 0 | 0 | 0 | 0.19 | 0.32 | 0.46 | 0.53 | 0.74 |
| | Example 2 | 20 | 0 | 0.09 | 0.22 | 0.28 | 0.43 | 0.52 | 0.83 | 0.98 |
| | | | 30 | 40 | 50 | 70 | 100 | 150 | 200 | 250 |
| a-ITO | Comparative Example 2 | 50 | 0 | 0 | 0.04 | 0.12 | 0.14 | 0.23 | 0.28 | 0.30 |
| | Example 2 | 40 | 0 | 0.10 | 0.17 | 0.24 | 0.35 | 0.37 | 0.49 | 0.62 |

Referring to Table 4, FIG. 7, and FIG. 8, in the case of IZO, the EPD time of Comparative Example 2 is 30 seconds, however the EPD time of Example 2 is 20 seconds. The etch speed of Example 2 is faster than that of Comparative Example 2.

In the case of the amorphous ITO, the EPD time of Comparative Example 2 is 50 seconds, however the EPD Time of Example 2 is 40 seconds. The etch speed of Example 2 is faster than that of Comparative Example 2.

As the result, the etchant composition for the transparent electrode layer according to an exemplary embodiment may improve the etch speed for the transparent electrode layer without also causing an attack on the aluminum and the copper.

Figure 9:
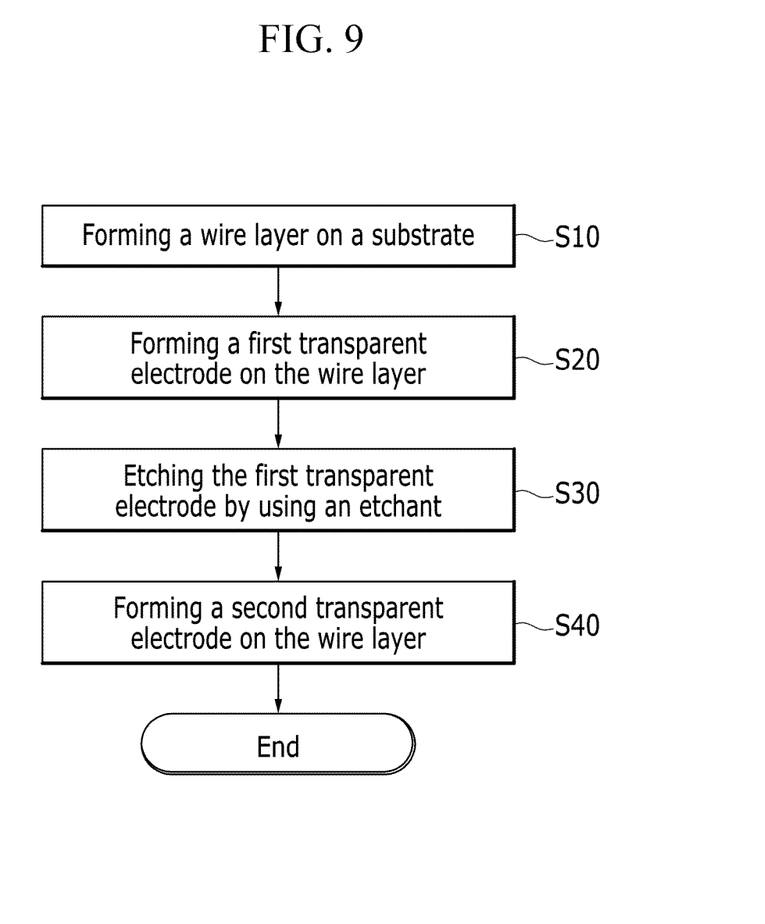
FIG. 9 is a flowchart of an etching method for a transparent electrode according to an exemplary embodiment.

FIG. 9 is a flowchart showing an etch method for a transparent electrode layer according to an exemplary embodiment. Referring to FIG. 9, a wiring layer is formed on a substrate (S10). The substrate may be a glass substrate, and the wiring layer may have, for example, a double-layered structure made of titanium and copper.

The first transparent electrode is formed on the wiring layer (S20). The first transparent electrode includes the indium oxide layer such as IZO or ITO.

The first transparent electrode is etched by using the etchant (S30).

The etchant includes the above-described etchant composition for the transparent electrode layer according to an exemplary embodiment. Accordingly, the copper formed thereunder is not damaged while removing the first transparent electrode.

If the first transparent electrode is removed, the wiring layer is exposed and the second transparent electrode is formed thereon. The second transparent electrode may be formed with the same material as the first transparent electrode.

Figure 10:
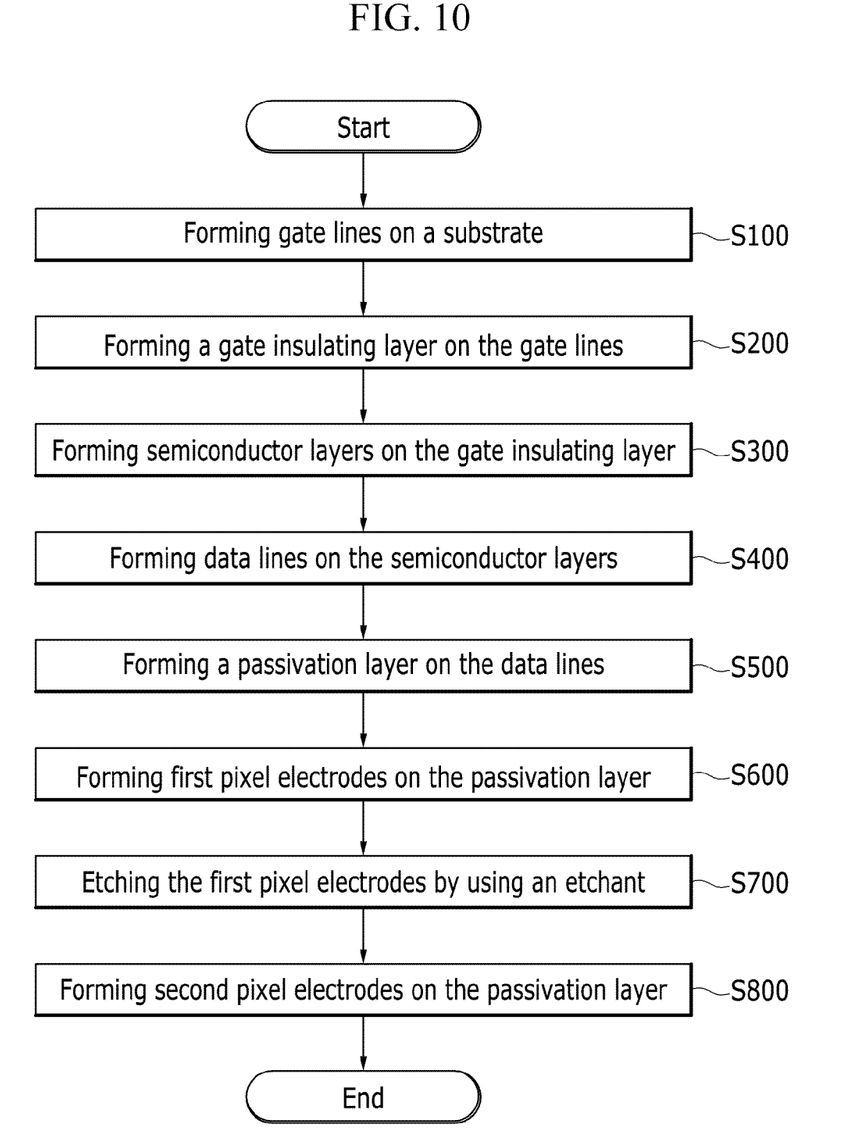
FIG. 10 is a flowchart showing a manufacturing method of a thin film transistor array panel according to an exemplary embodiment.
Figure 11:
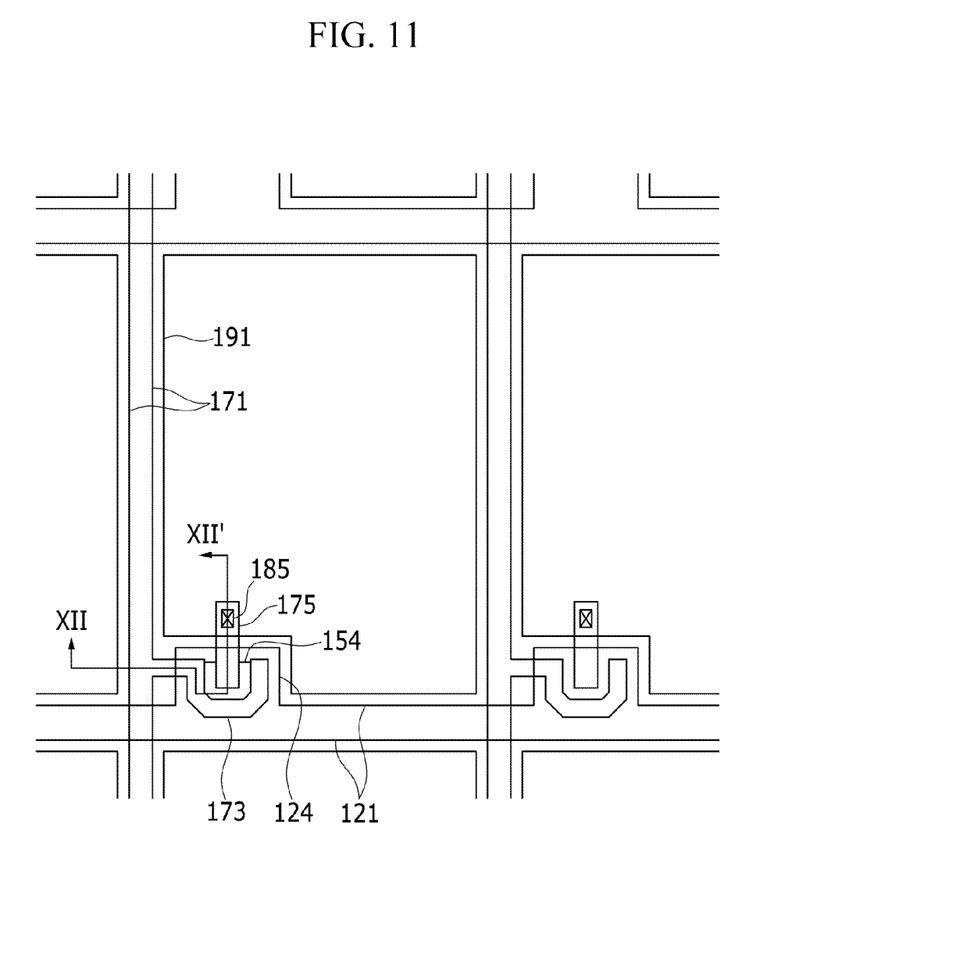
FIG. 11 is a top plan view of a thin film transistor array panel according to an exemplary embodiment.
Figure 12:
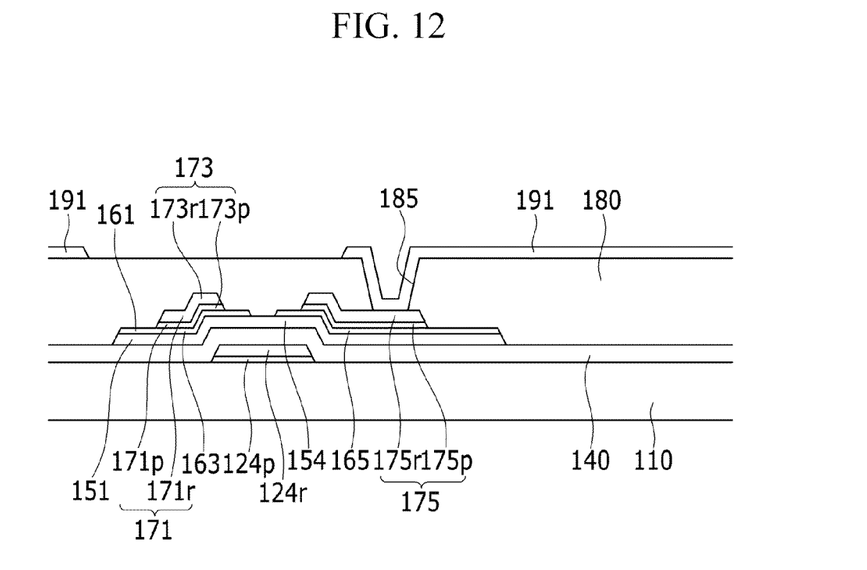
FIG. 12 is a cross-sectional view taken along the line XII-XII' of FIG. 11.

FIG. 10 is a flowchart showing a manufacturing method of a thin film transistor array panel according to an exemplary embodiment. FIG. 11 is a top plan view of a thin film transistor array panel according to an exemplary embodiment. FIG. 12 is a cross-sectional view taken along the line XII-XII' of FIG. 11.

Referring to FIG. 10 to FIG. 12, a plurality of gate lines 121 are formed on an insulation substrate 110 made of a transparent glass or plastic (S100). The gate lines 121 transfer a gate signal and mainly extend in a transverse direction. Each gate line 121 includes a plurality of gate electrodes 124 that protrude from the gate line 121.

The gate line 121 and gate electrodes 124 have a double-layered structure that includes lower layers 121p and 124p and upper layers 121r and 124r. The lower layers 121p and 124p include, for example, titanium (Ti) or a titanium alloy, and the upper layers 121r and 124r include, for example, copper (Cu) or a copper alloy.

A gate insulating layer 140 that is made of the insulating material such as silicon nitride is formed the gate lines 121 (S200). A plurality of semiconductor layers 151 made of hydrogenated amorphous silicon or polysilicon are formed on the gate insulating layer 140 (S300). The semiconductor layers 151 mainly extend in a longitudinal direction, and include a plurality of projections 154 that extend toward the gate electrodes 124.

A plurality of ohmic contact stripes 161 and ohmic contact islands 165 are formed on the projections 154 of the semiconductor layers 151. The ohmic contact stripes 161 have a plurality of protrusions 163, and the protrusions 163 and the ohmic contact islands 165 are disposed in pairs on the projections 154 of the semiconductor layer 151.

A plurality of data lines 171 and a plurality of drain electrodes 175 are formed on the ohmic contacts 161 and 165 and the gate insulating layer 140 (S400). The data lines 171 transfer the data signals and mainly extend in the longitudinal direction thereby intersecting the gate lines 121. Each data line 171 includes a plurality of source electrodes 173 extending toward the gate electrodes 124 and having a "U" shape.

The drain electrode 175 is separated from the data line 171, and extends toward an upper part in the middle of the U-shaped source electrode 173. The data line 171 including the source electrode 173 and the drain electrode 175 have the double-layered structure of the upper layers 171r, 173r, and 175r and lower layers 171p, 173p, and 175p. The upper layers 171r, 173r, and 175r include, for example, copper (Cu) or a copper alloy, and the lower layers 171p, 173p, and 175p include, for example, titanium (Ti), tantalum (Ta), molybdenum (Mo), or alloys thereof.

The lower layers 171p, 173p, and 175p and the upper layers 171r, 173r, and 175r of the data line 171 and the drain electrode 175 have tapered sides.

The ohmic contacts 161, 163, and 165 are present only between the underlying semiconductor layer 151 and the lower layers 171p, 173p, and 175p of the overlying data line 171 and drain electrode 175, and lower contact resistance therebetween In addition, the ohmic contacts 161, 163, and 165 have substantially the same plane pattern as the lower layers 171p, 173p, and 175p of the data line 171 and drain electrode 175.

The protrusion 154 of the semiconductor layer 151 includes a portion that is not covered by the data line 171 and the drain electrode 175, as well as a portion disposed between the source electrode 173 and the drain electrode 175.

The semiconductor layer 151, except for the exposed portion of the protrusion 154, has substantially the same plane pattern as the ohmic contact 161 and 165.

One gate electrode 124, one source electrode 173, and one drain electrode 175 form one thin film transistor (TFT) along with the protrusion 154 of the semiconductor 151. The channel of the thin film transistor is formed at the protrusion 154 between the source electrode 173 and the drain electrode 175.

A passivation layer 180 is formed on the data line 171, the drain electrode 175, and the exposed protrusion 154 of the semiconductor layer (S500). The passivation layer 180 is made of inorganic insulators such as silicon nitride or silicon oxide, an organic insulator, a low dielectric insulator, and the like. The passivation layer 180 directly covers the upper surface of the lower layers 171p, 173p, and 175p that is protruded outside the edge of the upper layers 171r, 173r, and 175r and the upper surface of the semiconductor layer 151 that is protruded outside the horizontal edge of the lower layers 171p, 173p, and 175p. The passivation layer 180 has a plurality of contact holes 185 exposing the portion of the drain electrodes 175.

A plurality of first pixel electrodes are formed on the passivation layer 180 (S600). Each first pixel electrode may be made of the transparent conductor such as ITO or IZO. The first pixel electrode is removed by using the etchant (S700).

The first pixel electrode may be formed through sputtering. However, the formation of the first pixel electrode may be erroneously produced in the manufacturing process. In this case, a reprocess process, or the rework process, is then executed, and the first pixel electrode may be removed by using the etchant. In such a case, the etchant used includes the above-described etchant composition for the transparent electrode layer according to an exemplary embodiment.

After removing the first pixel electrode, a plurality of second pixel electrodes 191 are formed on the exposed passivation layer (S800). The second pixel electrode 191 is physically and electrically connected to the drain electrode 175 through the contact hole 185, thereby receiving the data voltage from the drain electrode 175.

The second pixel electrode 191 to which the data voltage is applied forms an electric field in conjunction with a common electrode (not shown, it may be formed in a facing display panel or a thin film transistor array panel) that is applied with a common voltage, such that the direction of liquid crystal molecules of the liquid crystal layer (not shown) between two electrodes is determined. The second pixel electrode 191 and common electrode form a capacitor (hereinafter referred to as a liquid crystal capacitor) to maintain the applied voltage after the thin film transistor is turned off.

The pixel electrode 191 may be used to form a storage capacitor by overlapping it with a storage electrode line (not shown), and through this, the voltage maintaining ability of the liquid crystal capacitor may be increased.

The second pixel electrode 191 may be made of the transparent conductor such as ITO or IZO.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure.

<Description of symbols>

| | |
|---|---|
| 110: substrate | 121: gate line |
| 151: semiconductor layer | 154: protrusion of a semiconductor layer |
| 171: data line | 173: source electrode |
| 175: drain electrode | |

What is claimed is:

1. A method for manufacturing a thin film transistor array panel, comprising:
    forming a gate line on a substrate;
    forming a gate insulating layer covering the gate line;
    forming a semiconductor layer on the gate insulating layer;
    forming a data line and a drain electrode on the semiconductor layer;
    forming a passivation layer having a contact hole on the data line;
    forming a first pixel electrode connected to the drain electrode through the contact hole on the passivation layer;
    removing the first pixel electrode by using an etchant; and
    forming a second pixel electrode connected to the drain electrode through the contact hole on the passivation layer,
    wherein the etchant comprises an inorganic acid, an ammonium ($NH_4^+$)-containing compound, a cyclic amine compound, and water,
    wherein the inorganic acid comprises $H_2SO_4$ and another inorganic acid, and a concentration of $H_2SO_4$ is less than half of a concentration of the another inorganic acid.

2. The method of claim 1, wherein
    the data line and the drain electrode have a double-layered structure comprising a lower layer and an upper layer, the lower layer is formed of titanium (Ti), and the upper layer is formed of copper (Cu).

3. The method of claim 2, wherein
    a concentration of the inorganic acid is from 1 to 20 wt % of the entire etchant composition, a concentration of the ammonium containing compound is from 0.1 to 5.0 wt % of the entire etchant composition, and a concentration of the cyclic amine compound is from 0.1 to 5.0 wt % of the entire etchant composition.

4. The method of claim 3, wherein
    the cyclic amine compound comprises at least one of aminotetrazole, benzotriazole, imidazole, indol, phulin, pyrazolel, pyridine, pyrimidine, pyrrol, pyrrolidine, and pyrroline.

5. The method of claim 4, wherein
    the inorganic acid comprises at least one of $H_2SO_4$, $H_3PO_4$, $HNO_3$, HCl, and $HClO_4$.

6. The method of claim 5, wherein
    the first pixel electrode and the second pixel electrode comprise indium zinc oxide (IZO) or indium tin oxide (ITO).

7. The method of claim 1, wherein
    the ammonium ($NH_4^+$)-containing compound comprises at least one of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

8. The method of claim 1, wherein a concentration of the inorganic acid is from 7 to 20 wt % of the etchant composition, a concentration of the ammonium containing compound is from 0.1 to 5.0 wt % of the etchant composition, and a concentration of the cyclic amine compound is from 0.1 to 5.0 wt % of the etchant composition.

* * * * *